US006351799B1

(12) United States Patent
Födlmeier et al.

(10) Patent No.: US 6,351,799 B1
(45) Date of Patent: Feb. 26, 2002

(54) INTEGRATED CIRCUIT FOR EXECUTING SOFTWARE PROGRAMS

(75) Inventors: Dieter Födlmeier, Altdorf; Udo Stüting, Unterschleissheim; Bernd Brachmann, Peiting, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/115,170

(22) Filed: Jul. 14, 1998

Related U.S. Application Data

(63) Continuation of application No. PCT/DE97/02632, filed on Nov. 11, 1997.

(30) Foreign Application Priority Data

Nov. 14, 1996 (DE) .......................................... 196 47 181

(51) Int. Cl.⁷ .............................................. G06F 15/00
(52) U.S. Cl. ................................. 712/20; 712/1; 710/8; 714/7; 714/8; 714/30; 714/39; 326/39
(58) Field of Search .............................. 712/1, 20, 10, 712/15, 16; 326/39, 41; 710/8; 714/7, 30, 39

(56) References Cited

U.S. PATENT DOCUMENTS

| | | | | |
|---|---|---|---|---|
| 4,862,077 A | * | 8/1989 | Horel et al. | 324/754 |
| 4,990,800 A | | 2/1991 | Lee | |
| 5,076,801 A | * | 12/1991 | Schroll | 439/404 |
| 5,109,503 A | | 4/1992 | Cruickshank et al. | |
| 5,161,124 A | | 11/1992 | Love | |
| 5,189,598 A | * | 2/1993 | Bolan et al. | 361/748 |
| 5,556,290 A | * | 9/1996 | Northey et al. | 439/188 |
| 5,781,446 A | * | 7/1998 | Wu | 364/489 |
| 5,828,894 A | * | 10/1998 | Wilkinson et al. | 712/20 |
| 6,105,088 A | * | 8/2000 | Pascale et al. | 710/100 |

FOREIGN PATENT DOCUMENTS

| | | |
|---|---|---|
| DE | 42 07 266 A1 | 9/1993 |
| EP | 0 009 862 A1 | 4/1980 |

OTHER PUBLICATIONS

International Publication No. WO 94/06077 (Buchenrieder), dated Mar. 17, 1994.
International Publication No. WO 92/08671 (Hepter), dated May 29, 1992.
International Publication No. WO 92/15966 (Murayama et al.), dated Sep. 17, 1992.
International Publication No. WO 97/31311 (Lynch), dated Aug. 28, 1997.
"Innovative Packages emerge to carry faster, denser chips" (DeSena), Computer Design, Oct. 1, 1988, pp. 35–40.

* cited by examiner

Primary Examiner—Mark Zimmerman
Assistant Examiner—Mackly Monestime
(74) Attorney, Agent, or Firm—Herbert L. Lerner; Laurence A. Greenberg; Werner H. Stemer

(57) ABSTRACT

The integrated circuit executes software programs. The electronic components of the integrated circuit and/or the electrical connections between them can be selectively broken and/or created. The wiring of the electronic components and/or their function and/or their mode of operation are thereby at least partly individually configured. The connections are thereby configured dynamically and in parallel during the operation of the integrated circuit.

13 Claims, 1 Drawing Sheet

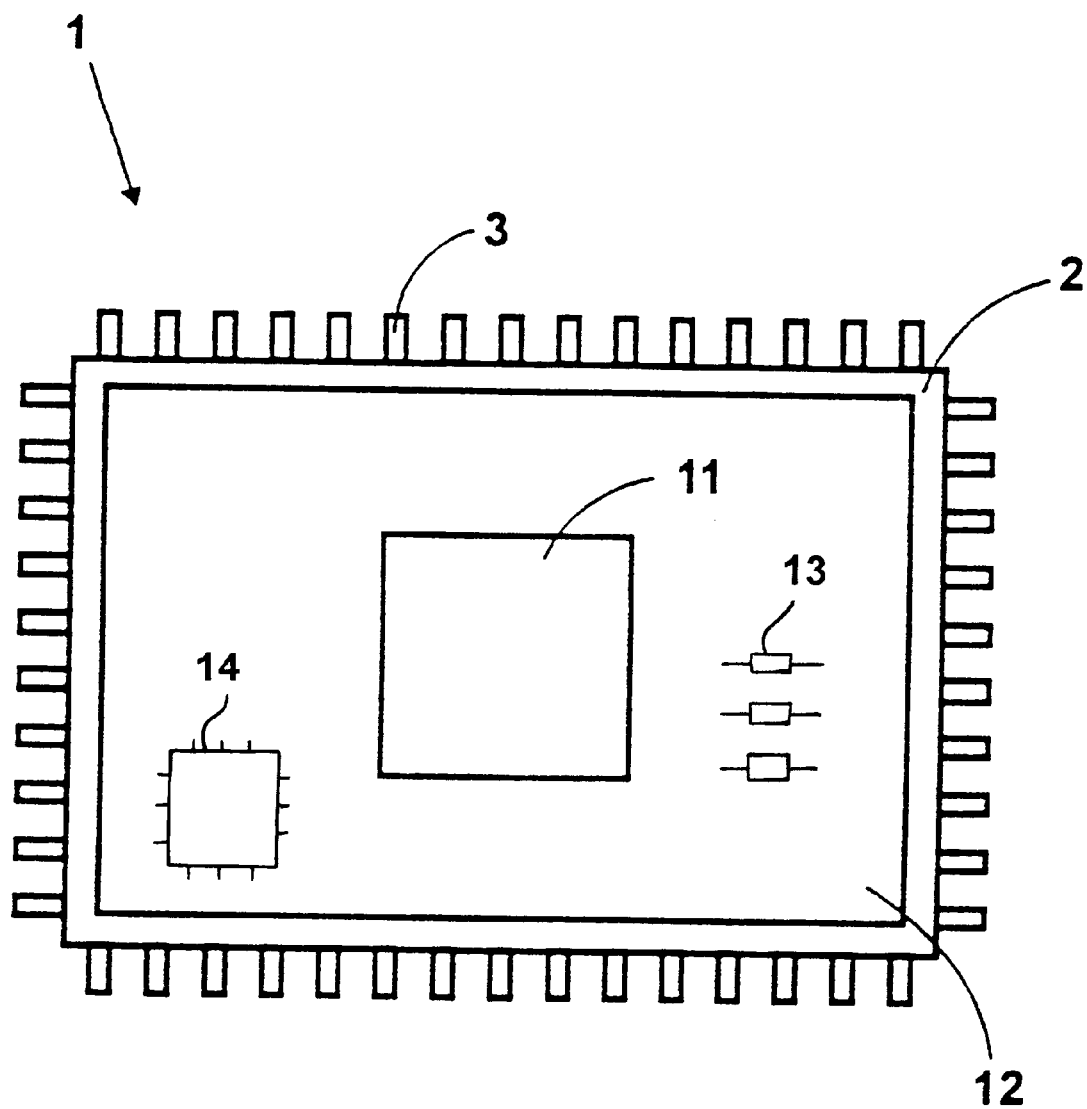

INTEGRATED CIRCUIT FOR EXECUTING SOFTWARE PROGRAMS

CROSS-REFERENCE TO RELATED APPLICATION

This is a continuation of copending International Application PCT/DE97/02632, filed on Nov. 11, 1997, which designated the United States.

BACKGROUND OF THE INVENTION

Field of the Invention

The invention relates to integrated circuits and, more particularly, to an integrated circuit designed for the execution of software programs.

Integrated circuits of this type are particularly often contained in microprocessors, microcontrollers, signal processors and the like. Such circuits exist in a great number of widely varying embodiments and they are widespread.

Although microprocessors, microcontrollers, signal processors and the like are available in a wide variety of embodiments (or perhaps even just because of this), it is difficult or sometimes even impossible to find a version which can meet the requirements imposed in a specific individual case (and only these requirements).

If the microprocessor, microcontroller, signal processor or the like which is selected is one which, for whatever reason, cannot meet all the imposed requirements, then this will generally increase the outlay on the hardware in which it is to be used.

If, however, the microprocessor, microcontroller, signal processor or the like which is selected is one which has more than the required capacity, then this will generally increase the cost of the product containing it.

SUMMARY OF THE INVENTION

It is accordingly an object of the invention to provide an integrated circuit for processing software programs, which overcomes the above-mentioned disadvantages of the prior art devices and methods of this general type and which can in each case be used optimally for a large number of widely varying applications.

With the foregoing and other objects in view there is provided, in accordance with the invention, an integrated circuit device for executing software programs, comprising:

a multiplicity of electronic components and electrical connections extending between the electronic components; the electronic components and the electrical connections being disposed such that one of an interconnection of the electronic components, a function thereof, and a mode of operation thereof is individually configurable by selectively breaking or creating the connections dynamically and in parallel during an operation of the integrated circuit device.

In other words, the electronic components of the integrated circuit and/or the electrical connections provided between the components are at least in part arranged in such a way that the interconnection of the electronic components and/or their function and/or their mode of operation can be individually configured by selectively breaking and/or making connections. The configuration of the connections is thereby carried out dynamically and in parallel during the operation of the integrated circuit.

An integrated circuit of this type can therefore, unlike customary integrated circuits of the type in question, be configured at the hardware level.

This hardware-level configurability makes it possible to match the integrated circuit in virtually any way to the respectively desired conditions. This matching is carried out dynamically during the operating time of the integrated circuit. Advantageously, the configuration of the connections is carried out internally by the integrated circuit itself. By virtue of the dynamic and internal configuration of the connections, the integrated circuit can be matched to the respective requirements without the need to interrupt the operation of the integrated circuit.

If, for example, that part of the integrated circuit which executes the software programs is provided in the form of an intelligent core of the integrated circuit, and a hardware-configurable part of the integrated circuit is disposed between the intelligent core and the input and/or output terminals (pins) of the integrated circuit, then the user can allocate any desired functions to any of the input and/or output terminals. It is therefore possible, to name only one of a virtually unlimited number of examples, for an arbitrary number of pins to be configured as input and/or output terminals for an arbitrary number of serial or parallel interfaces.

As an alternative, or in addition, provision may be made to make at least parts of the intelligent core configurable at the hardware level. It is in this way possible to affect the function and the mode of operation of the intelligent core, which, again to name only one of a virtually unlimited number of examples, can be used as a way of selecting, affecting and/or creating the instruction decoder (individual matching to an instruction set desired by the user).

With the above and other objects in view there is also provided, in accordance with the invention, a method of programming and operating an integrated circuit device for executing software programs, which comprises:

providing an integrated circuit device with a core region having an integrated circuit for executing software programs, a programmable peripheral region disposed around the core region, and a plurality of terminals for electrically contacting the integrated circuit device;

connecting the integrated circuit of the core region to the terminals through the programmable peripheral region; and dynamically and in parallel during an operation of the integrated circuit device, selectively breaking or creating the connections for configuring electronic components of the integrated circuit device or the electrical connections thereof such that an interconnection of the electronic components, a function thereof, and/or a mode of operation thereof is individually configured.

In accordance with an additional feature of the invention, therefore, the peripheral region is configurable such that the terminals of the integrated circuit device are at least in part individually allocatable.

In accordance with another feature of the invention, the peripheral region is configurable such that data signals input or output via the terminals are processed in the peripheral region.

In accordance with a further feature of the invention, the peripheral region is configurable to selectively process signals or data input and output through the terminals.

In accordance with again a further feature of the invention, the core region is configurable to individual program instruction to be carried out therein.

The intelligent core is in this case to be regarded as a status machine. The status machine has a predetermined number of states, which run in a fixed predetermined scheme. In particular, the intelligent core may be a microcontroller, a microprocessor, a digital signal processor, or the like.

In accordance with again another feature of the invention, the peripheral region contains a multiplicity of programmable gate elements such as, for example, FPGAs, PLDs, PLAs or the like. It is also particularly advantageous, in accordance with yet another feature of the invention, if the peripheral region is formed by at least one coprocessor, which is dynamically connected up to the intelligent core should the latter, for example, require additional computing power or if data need to be processed more rapidly.

Overall, the hardware-level configurability of an integrated circuit, designed for the execution of software programs, allows the latter to be matched to a very wide variety of requirements.

An integrated circuit has therefore been provided which can in each case be used optimally for a large number of widely varied applications.

Other features which are considered as characteristic for the invention are set forth in the appended claims.

Although the invention is illustrated and described herein as embodied in an integrated circuit for processing software programs, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawing.

BRIEF DESCRIPTION OF THE DRAWINGS

The FIGURE shows a schematic representation of an integrated circuit formed in accordance with the invention.

DETAILED DESCRIPTION OF THE PREFERRED EMBODIMENT

Referring now to the sole FIGURE of the drawing in detail, there is seen an integrated circuit generally denoted by the reference numeral 1.

The integrated circuit 1 is fitted in a package 2 with a multiplicity of input and/or output terminals or pins 3. It will be understood, however, that the circuit may also be provided as an unpackaged chip or fitted in any other desired packages.

The integrated circuit 1 shown in the figure consists of a core region 11 and a peripheral region 12.

The core region 11 is a region of the integrated circuit that is designed for the execution of software programs and corresponds in terms of function and mode of operation to the intelligent core of a microprocessor, microcontroller, signal processor or the like.

The peripheral region 12 surrounding the core region 11 represents the connection between the core region 11 and the input and/or output terminals 3. The peripheral region 12 is formed with a multiplicity of electronic components which, in particular, represent gates whose interconnection and/or whose function and/or mode of operation can be at least in part individually configured. This configuration is effected, in particular, by selectively breaking and/or creating connections between the electronic components.

Electrical connections between the components of the peripheral region or the gates 12 which they form may be broken and/or made in a wide variety of ways.

One option of breaking connections consists in melting fuses 13 or the like, provided in the connection path, by means of a correspondingly heavy electric current.

A further option of breaking connections consists in the integration of non-volatile memory elements, used as switching elements or in switching elements, for example ROM, EPROM, EEPROM, flash EPROM cells or the like; the connection, whose state (made or broken) can in this case be made dependent on the value stored in the respective memory element, may in this case not only be broken, but also remade or reproduced.

A new permanent connection between two components to be connected may also be made through the defined destruction of a further component, provided between the components to be connected, such that a permanent and continuous connection between the components to be connected is in this way made.

It will be understood that the foregoing examples of breaking and/or making electrical connections between components represent only some of the suitable options. Alternatives and/or supplementary possibilities are known and need not be explained further.

The integrated circuit need not only be configured by breaking and/or making electrical connections. In addition, or as an alternative, provision may be made for the function and mode of operation of the electronic components of the integrated circuit to be affected selectively by non-volatile operating mode adjustment, controlled partial destruction or the like.

As regards the way in which the electronic components of the integrated circuit and/or the connections between them are to be formed in order to be hardware-configurable, and regarding the way in which the integrated circuit is ultimately to be configured at the hardware level, reference may also be made to the measures provided for these or similar purposes in the context of known programmable logic, for example PLAs (programmable logic arrays), GALs (gate array logic), PLDs (programmable logic devices), FPGAs (field programmable gate arrays) and the like. The measures known from hardware-configurable logic for the hardware-level configuration thereof can basically also be used for configuring the integrated circuit according to the invention.

The configuration of the integrated circuit 1 in question does not take place until after the integrated circuit has been produced and fitted in a package. In a preferred mode, the circuit is electrically configured by applying corresponding voltages or signals to predetermined input and/or output terminals 3. In addition, or as an alternative, optical processes (using UV light, laser beams or the like) or similar processes may also be employed.

The integrated circuit 1 is configured, for example, by using a hardware programming language such as VHDL or the like.

Through the configuration of the peripheral region 12, it is possible for connections to be made between the individual input and/or output terminals 3 and the intelligent core, executing the software programs, in the (from a logical point of view) central core region 11 of the integrated circuit. The connections can be routed via a varying arbitrary number of and arbitrarily interconnected components or gates, and can reach the core region 11 at a varying number of arbitrary points.

This opens up the possibility of having the individual input and/or output terminals individually allocated functions which are optimally matched to the respective requirements of the user of the integrated circuit. Thus, for example, an arbitrary number, within certain limits, of serial and/or parallel interfaces (I/O interfaces) may be provided.

Besides this, the components of the peripheral region 12, or the gates formed by them, may be interconnected in such a way that preprocessing and/or postprocessing of the signals or data which are input and/or are to be output via the input and/or output terminals 3 can be performed in the peripheral region. An example of a result which may be achieved in this way is that coding and/or decoding of signals or data which are input (or are to be output) can be carried out in the peripheral region 12. In one embodiment, therefore, a coprocessor 14 may be disposed in the peripheral region 12.

Data or signal processing carried out in the peripheral region 12 can be carried out at a speed which is generally higher than the speed which would be achievable if the processing were to be performed under software control in the intelligent core. On the other hand, moving the processing into the integrated circuit may considerably simplify the hardware in which the integrated circuit is to be embedded.

In an alternative embodiment of the invention, it is also possible to not only render the peripheral region 12 hardware-configurable, but also the core region 11. As a result, the instruction decoder of the intelligent core may be configured, or one of several instruction decoders may be selected, as a result of which their instruction set can be individually established and/or changed. This, of course, is in contrast to prior known microprocessors, microcontrollers and signal processors.

Those skilled in the pertinent art will appreciate that the above-mentioned possibilities and options that result from the hardware-level configurability of the core region 11 and/or of the peripheral region 12 of the integrated circuit, for influencing its function and/or mode of operation, are but a few examples used for the purpose of illustration. In principle, providing hardware-level configurability in integrated circuits designed for the execution of software programs opens up the possibility of matching it in terms of virtually all its technical properties to the individual requirements.

Although the above-described integrated circuit is more complicated in construction than customary ICs (non-hardware-configurable ICs), it need not be more expensive to produce. Owing to the fact that, due to hardware-level configuration, the same integrated circuit can be matched in virtually any way to individual requirements, it can be produced in enormously large numbers, which readily compensates in terms of economics for the disadvantage of its complicated structure.

In summary, the above-described integrated circuit, designed for the execution of software programs, can in each case be used optimally, both in economic and in technical terms, for a large number of widely varied applications.

We claim:

1. An integrated circuit device for executing software programs, comprising:
   a multiplicity of electronic components and electrical connections extending between said electronic components;
   said electronic components and said electrical connections being constructed such that one of an interconnection of said electronic components, a function thereof, and a mode of operation thereof is individually configurable by selectively breaking or creating said connections dynamically during an operation of the integrated circuit device.

2. The integrated circuit device according to claim 1, wherein said connections are configured internally by the integrated circuit device.

3. The integrated circuit device according to claim 1, which comprises a core region for executing software programs, a programmable peripheral region outside said core region, and a plurality of terminals for electrically connecting the integrated circuit.

4. The integrated circuit device according to claim 3, wherein said terminals are a plurality of input terminals and a plurality of output terminals.

5. The integrated circuit device according to claim 3, wherein said peripheral region is configurable such that said terminals of the integrated circuit device are at least in part individually allocatable.

6. The integrated circuit device according to claim 3, wherein said peripheral region is configurable such that data signals input or output via said terminals are processed in said peripheral region.

7. The integrated circuit device according to claim 3, wherein said peripheral region is configurable to selectively process signals or data input and output through said terminals.

8. The integrated circuit device according to claim 3, wherein said core region is configurable to individually program instruction to be carried out therein.

9. The integrated circuit device according to claim 3, wherein said core region contains at least one hardware device selected from the group consisting of a microprocessor, a microcontroller, and a signal processor having a predetermined number of states.

10. The integrated circuit device according to claim 9, wherein said peripheral region contains at least one coprocessor selectively connectable to said core region.

11. The integrated circuit device according to claim 3, wherein said peripheral region contains at least one coprocessor selectively connectable to said core region.

12. The integrated circuit device according to claim 3, wherein said peripheral region contains a multiplicity of programmable gate elements.

13. A method of programming and operating an integrated circuit device for executing software programs, which comprises:
   providing an integrated circuit device with a core region having an integrated circuit for executing software programs, a programmable peripheral region constructed around said core region, and a plurality of terminals for electrically contacting the integrated circuit device;
   connecting the integrated circuit of the core region to the terminals through the programmable peripheral region; and dynamically during an operation of the integrated circuit device, selectively breaking or creating the connections for configuring electronic components of the integrated circuit device or the electrical connections thereof such that an interconnection of the electronic components, a function thereof, and/or a mode of operation thereof is individually configured.

* * * * *

(12) EX PARTE REEXAMINATION CERTIFICATE (9465th)
United States Patent
Födlmeier et al.

(10) Number: US 6,351,799 C1
(45) Certificate Issued: Jan. 4, 2013

(54) INTEGRATED CIRCUIT FOR EXECUTING SOFTWARE PROGRAMS

(75) Inventors: Dieter Födlmeier, Altdorf (DE); Udo Stüting, Unterschleissheim (DE); Bernd Brachmann, Peiting (DE)

(73) Assignee: Lantiq Deutschland GmbH, Neubiberg (DE)

Reexamination Request:
No. 90/012,034, Dec. 6, 2011

Reexamination Certificate for:
Patent No.: 6,351,799
Issued: Feb. 26, 2002
Appl. No.: 09/115,170
Filed: Jul. 14, 1998

Related U.S. Application Data

(63) Continuation of application No. PCT/DE97/02632, filed on Nov. 11, 1997.

(30) Foreign Application Priority Data

Nov. 14, 1996 (DE) .................................. 196 47 181

(51) Int. Cl.
*G06F 15/00* (2006.01)
(52) U.S. Cl. .................... 712/20; 326/39; 710/8; 712/1; 712/E9.028; 714/30; 714/39; 714/6.32
(58) Field of Classification Search ........................ None
See application file for complete search history.

(56) References Cited

To view the complete listing of prior art documents cited during the proceeding for Reexamination Control Number 90/012,034, please refer to the USPTO's public Patent Application Information Retrieval (PAIR) system under the Display References tab.

*Primary Examiner* — Joshua Campbell

(57) ABSTRACT

The integrated circuit executes software programs. The electronic components of the integrated circuit and/or the electrical connections between them can be selectively broken and/or created. The wiring of the electronic components and/or their function and/or their mode of operation are thereby at least partly individually configured. The connections are thereby configured dynamically and in parallel during the operation of the integrated circuit.

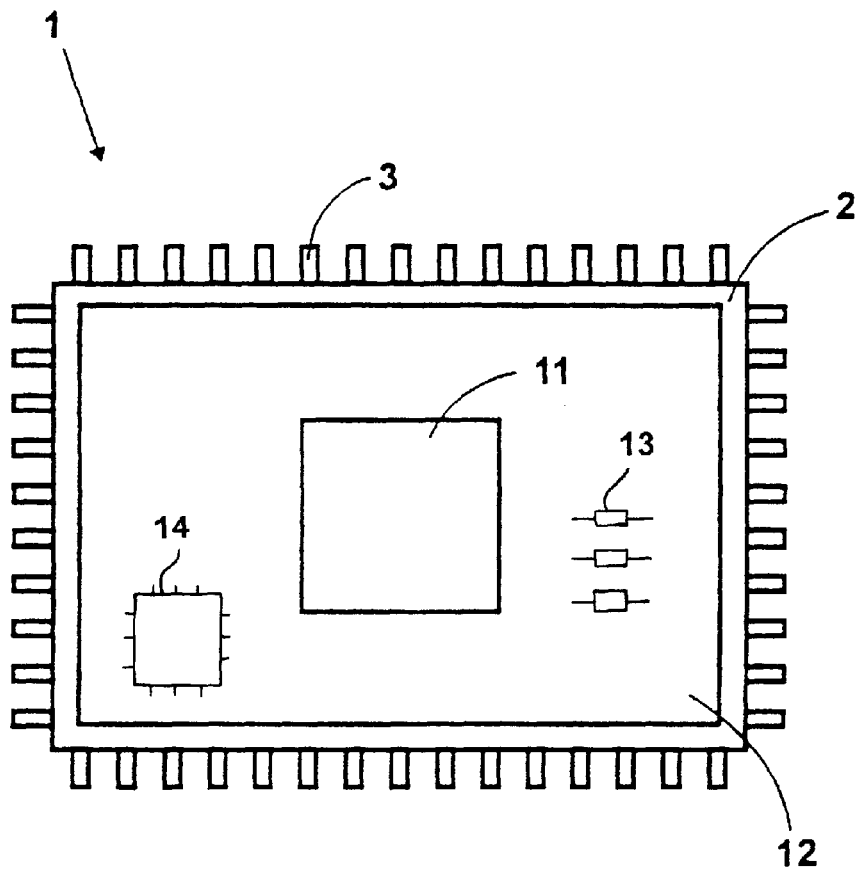

US 6,351,799 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-13 is confirmed.

New claims 14-73 are added and determined to be patentable.

*14. The integrated circuit device according to claim 10, wherein the coprocessor is configured to perform coding or decoding of data or signals.*

*15. The integrated circuit device of claim 10, wherein the core region is configured to off-load processing to the coprocessor.*

*16. The integrated circuit device according to claim 11, wherein the coprocessor is configured to perform coding or decoding of data or signals.*

*17. The integrated circuit device of claim 11, wherein the core region is configured to off-load processing to the coprocessor.*

*18. The integrated circuit device according to claim 12, wherein the programmable gate elements include at least one of a programmable logic array (PLA), a gate array logic (GAL), a programmable logic device (PLD) and a field programmable gate array (FPGA).*

*19. The integrated circuit device according to claim 3, wherein the multiplicity of said electronic components and electrical connections extending between said electronic components are disposed in the peripheral region.*

*20. The integrated circuit device according to claim 3 wherein the core region is non-hardware-configurable.*

*21. The integrated circuit device according to claim 3 wherein the core region is hardware-configurable.*

*22. The integrated circuit device according to claim 1 comprising:*
 *a configurable peripheral region that includes said multiplicity of electronic components and electrical connections extending between said electronic components; and*
 *a core region configured to execute software programs.*

*23. The integrated circuit device according to claim 22 wherein the core region is non-hardware-configurable.*

*24. The integrated circuit device according to claim 22 wherein the core region is hardware-configurable.*

*25. The integrated circuit device of claim 22 wherein the configurable peripheral region comprises a serial interface.*

*26. The integrated circuit device of claim 22 wherein the configurable peripheral region comprises a parallel interface.*

*27. The integrated circuit device according to claim 22, wherein said peripheral region is configurable to selectively process signals or data input and output through said terminals, wherein data or signal processing in the peripheral region is performed at a speed higher than a speed which would be achievable if the processing were performed under software control in the core.*

*28. The integrated circuit of claim 22, comprising a plurality of terminals for electrically connecting the integrated circuit.*

*29. The integrated circuit device of claim 1 comprising a core region configured to execute software programs.*

*30. The integrated circuit device according to claim 29 wherein the core region is non-hardware-configurable.*

*31. The integrated circuit device according to claim 29 wherein the core region is hardware-configurable.*

*32. The integrated circuit device according to claim 1, comprising:*
 *a core region configured to execute software programs;*
 *wherein said breaking or creating is performed without interrupting the operation of the core region.*

*33. The integrated circuit device according to claim 32 wherein the core region is non-hardware-configurable.*

*34. The integrated circuit device according to claim 32 wherein the core region is hardware-configurable.*

*35. The integrated circuit device according to claim 1, comprising:*
 *a core region configured to execute software programs;*
 *wherein said breaking or creating is performed during the operation of the core region.*

*36. The integrated circuit device according to claim 35 wherein the core region is non-hardware-configurable.*

*37. The integrated circuit device according to claim 35 wherein the core region is hardware-configurable.*

*38. The integrated circuit device according to claim 1, comprising:*
 *a core region configured to execute software programs;*
 *wherein said breaking or creating is performed in parallel with the operation of the core region.*

*39. The integrated circuit device according to claim 38 wherein the core region is non-hardware-configurable.*

*40. The integrated circuit device according to claim 38 wherein the core region is hardware-configurable.*

*41. The integrated circuit device according to claim 1 comprising a serial interface.*

*42. The integrated circuit device according to claim 1 comprising a parallel interface.*

*43. The integrated circuit device according to claim 1, further comprising a plurality of switching elements for facilitating said breaking or creating said connections.*

*44. The integrated circuit device according to claim 43, wherein said switching elements are memory elements.*

*45. The integrated circuit device according to claim 44, wherein a state of one of said connections is made or broken depending on a value stored in a respective memory element.*

*46. The integrated circuit device according to claim 44, wherein said memory elements are non-volatile memory elements.*

*47. The integrated circuit device according to claim 1 wherein said electronic components and said electrical connections being constructed such that one of an interconnection of said electronic components, a function thereof, and a mode of operation thereof is individually configurable based on a hardware programming language.*

*48. The integrated circuit device of claim 47 wherein the hardware programming language is VHDL.*

*49. The method of claim 13, wherein said breaking or creating is performed without interrupting the operation of the core region.*

*50. The method of claim 49 wherein the core region is non-hardware-configurable.*

51. The method of claim 49 wherein the core region is hardware-configurable.

52. The method of claim 13, wherein said breaking or creating is performed during the operation of the core region.

53. The method of claim 52 wherein the core region is non-hardware-configurable.

54. The method of claim 52 wherein the core region is hardware-configurable.

55. The method of claim 13, wherein said breaking or creating is performed in parallel with the operation of the core region.

56. The method of claim 55 wherein the core region is non-hardware-configurable.

57. The method of claim 55 wherein the core region is hardware-configurable.

58. The method of claim 13, wherein the core region is non-hardware-configurable.

59. The method of claim 13, wherein the core region is hardware-configurable.

60. The method of claim 13, wherein the peripheral region comprises a serial interface.

61. The method of claim 13, wherein the peripheral region comprises a parallel interface.

62. The method according to claim 13, further comprising configuring the peripheral region to selectively process signals or data input and output through said terminals, wherein data or signal processing in the peripheral region is performed at a speed higher than a speed which would be achievable if the processing were performed under software control in the core.

63. The method of claim 13, further comprising providing a coprocessor in the peripheral region.

64. The method of claim 63, wherein the coprocessor is configured to perform coding or decoding of data or signals.

65. The method of claim 63 further comprising off-loading processing from the core region to the coprocessor.

66. The method of claim 13, wherein the peripheral region includes at least one of a programmable logic array (PLA), a gate array logic (GAL), a programmable logic device (PLD) and a field programmable gate array (FPGA).

67. The method of claim 13, wherein said breaking or creating of said connections are facilitated by a plurality of switching elements.

68. The method of claim 67, wherein said switching elements are memory elements.

69. The method of claim 68, further comprising making or breaking one of said connections depending on a value stored in a respective memory element.

70. The method of claim 68, wherein said memory elements are non-volatile memory elements.

71. The method of claim 13 comprising individually configuring one or more of said interconnections, said function thereof, and said mode of operation thereof based on a hardware programming language.

72. The method of claim 71, wherein the hardware programming language is VHDL.

73. The method of claim 13, wherein said selectively breaking or creating is performed after the integrated circuit is fitted in a package.

\* \* \* \* \*